United States Patent
Park et al.

(10) Patent No.: US 9,793,399 B2
(45) Date of Patent: Oct. 17, 2017

(54) SEMICONDUCTOR DEVICE HAVING INSULATING PATTERN AND METHOD OF FORMING THE SAME

(71) Applicant: Samsung Electronics Co., Ltd., Suwon-si (KR)

(72) Inventors: Pan-Kwi Park, Incheon (KR); Koung-Min Ryu, Hwaseong-si (KR); Moon-Han Park, Yongin-si (KR); Hyung-suk Jung, Suwon-si (KR); Jong-hoon Baek, Ansan-si (KR); Su-Young Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/573,429

(22) Filed: Dec. 17, 2014

(65) Prior Publication Data

US 2016/0020324 A1 Jan. 21, 2016

(30) Foreign Application Priority Data

Jul. 17, 2014 (KR) ........................ 10-2014-0090622

(51) Int. Cl.

| | |
|---|---|
| *H01L 29/78* | (2006.01) |
| *H01L 29/66* | (2006.01) |
| *H01L 29/08* | (2006.01) |
| *H01L 21/8234* | (2006.01) |
| *H01L 21/8238* | (2006.01) |
| *H01L 29/49* | (2006.01) |
| *H01L 29/51* | (2006.01) |
| *H01L 29/165* | (2006.01) |

(52) U.S. Cl.
CPC .. *H01L 29/7848* (2013.01); *H01L 21/823412* (2013.01); *H01L 21/823425* (2013.01); *H01L 21/823481* (2013.01); *H01L 21/823878* (2013.01); *H01L 29/0847* (2013.01); *H01L 29/66545* (2013.01); *H01L 29/66628* (2013.01); *H01L 29/66636* (2013.01); *H01L 29/165* (2013.01); *H01L 29/4966* (2013.01); *H01L 29/517* (2013.01)

(58) Field of Classification Search
None
See application file for complete search history.

(56) References Cited

U.S. PATENT DOCUMENTS

| | | | |
|---|---|---|---|
| 8,497,554 B2 | 7/2013 | Wei et al. | |
| 2008/0023773 A1* | 1/2008 | Shimamune | ........ H01L 29/165 257/377 |
| 2009/0242995 A1 | 10/2009 | Suzuki et al. | |

(Continued)

FOREIGN PATENT DOCUMENTS

| | | |
|---|---|---|
| KR | 100234692 | 12/1999 |
| KR | 100390949 | 7/2003 |

*Primary Examiner* — Erik Kielin
(74) *Attorney, Agent, or Firm* — Onello & Mello, LLP

(57) ABSTRACT

A semiconductor device includes a stressor and an insulating pattern. A device isolation layer is formed to define an active area on a substrate. A first gate electrode is formed on the active area. A second gate electrode is formed on the device isolation layer. A trench is formed in the active area between the first gate electrode and the second gate electrode. A stressor is formed in the trench. A cavity formed between the stressor and the device isolation layer and adjacent to the second gate electrode is disposed. An insulating pattern is formed in the cavity.

20 Claims, 16 Drawing Sheets

(56) References Cited

U.S. PATENT DOCUMENTS

| | | | | |
|---|---|---|---|---|
| 2010/0093147 | A1* | 4/2010 | Liao | H01L 21/28123 |
| | | | | 438/300 |
| 2011/0266625 | A1* | 11/2011 | Carter | H01L 21/28247 |
| | | | | 257/365 |
| 2012/0043624 | A1* | 2/2012 | Liang | H01L 21/28123 |
| | | | | 257/410 |
| 2012/0223364 | A1* | 9/2012 | Chung | H01L 21/823807 |
| | | | | 257/192 |
| 2012/0235245 | A1* | 9/2012 | Pal | H01L 21/82348 |
| | | | | 257/368 |
| 2013/0270648 | A1* | 10/2013 | Manabe | H01L 27/092 |
| | | | | 257/369 |
| 2014/0087535 | A1* | 3/2014 | Roh | H01L 21/823412 |
| | | | | 438/285 |
| 2015/0054084 | A1* | 2/2015 | Ekbote | H01L 27/088 |
| | | | | 257/368 |

* cited by examiner

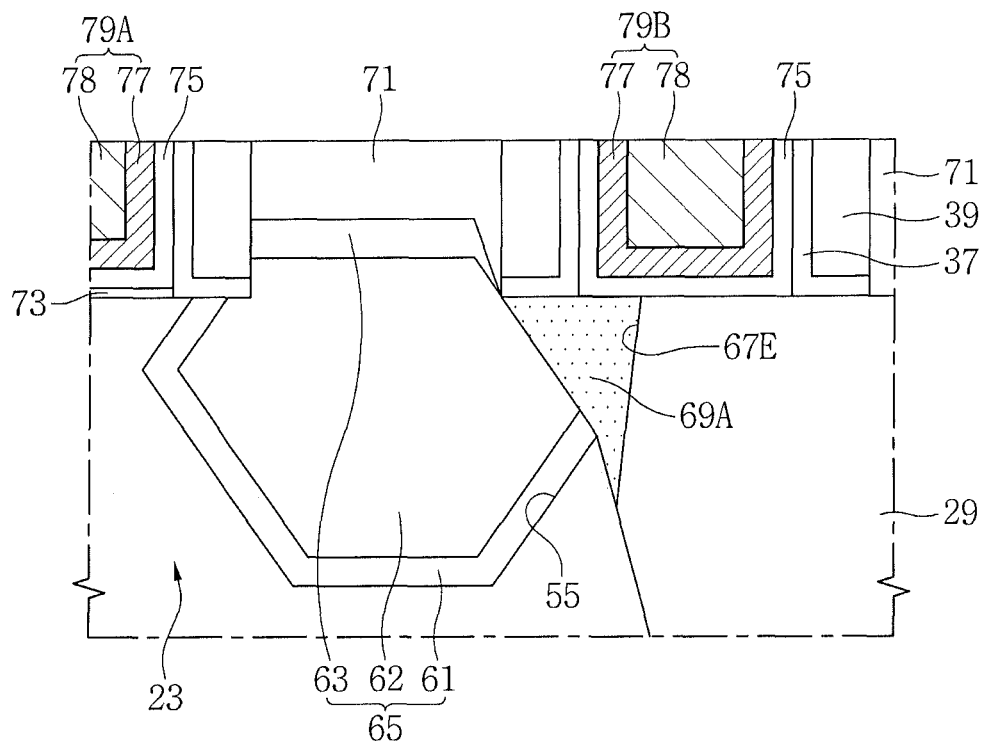
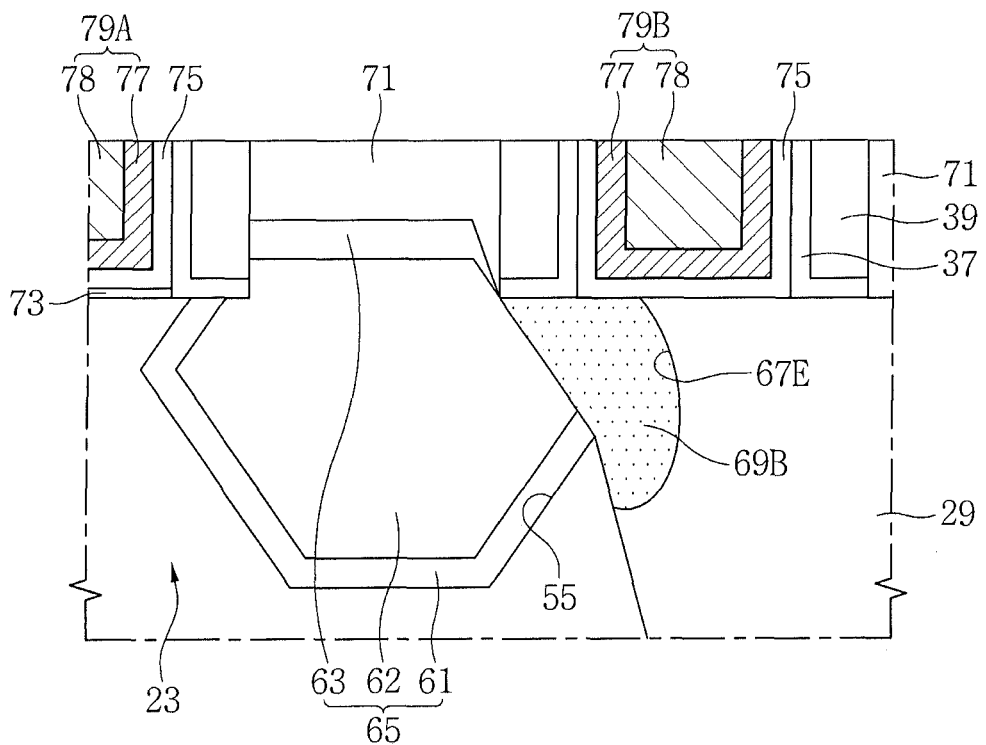

SEMICONDUCTOR DEVICE HAVING INSULATING PATTERN AND METHOD OF FORMING THE SAME

CROSS-REFERENCE TO RELATED APPLICATION

This application claims priority under 35 U.S.C. §119 to Korean Patent Application No. 10-2014-0090622 filed on Jul. 17, 2014, the disclosure of which is hereby incorporated by reference in its entirety.

BACKGROUND

Technical Field

Embodiments of the inventive concepts relate to a semiconductor device having a stressor and an insulating pattern and a method of forming the same.

Description of Related Art

Various methods have been studied to improve electrical characteristics of a semiconductor device using stressors. A plurality of gate lines spaced apart from each other may be formed on a substrate. The stressors may be formed in the substrate between the gate lines. According to high integration of the semiconductor device, a distance between the stressor and adjacent gate line is gradually becoming narrow. A leakage current between the stressor and the gate lines is gradually increased.

SUMMARY

Embodiments of the inventive concepts provide a semiconductor device capable of blocking a leakage current between a stressor and a gate line.

Embodiments of the inventive concepts provide a method of forming the semiconductor device capable of blocking a leakage current between the stressor and the gate line.

In accordance with an aspect of the inventive concepts, a semiconductor device includes device isolation layers configured to define an active area on a substrate. A first gate electrode is on the active area. A second gate electrode is on the device isolation layer. A trench is in the active area between the first gate electrode and the second gate electrode. A stressor is in the trench. A cavity is between the stressor and the device isolation layer and adjacent to the second gate electrode. An insulating pattern is in the cavity.

The insulating pattern may overlap a lower portion of the second gate electrode.

The insulating pattern may directly contact a side surface of the stressor and the device isolation layer.

The insulating pattern may include an air gap.

The cavity may expand between the active area and the device isolation layer.

The insulating pattern may directly contact a side surface of the active area.

An upper portion of the insulating pattern may have a width greater than a lower portion thereof.

A gate dielectric layer may be under the second gate electrode. An interface between the insulating pattern and the gate dielectric layer may be at a higher level than an interface between the insulating pattern and the device isolation layer.

The insulating pattern may include silicon oxide, silicon nitride, silicon oxy-nitride, a metal oxide, or a combination thereof.

A spacer may be on a side surface of the second gate electrode. The insulating pattern may overlap the spacer.

The insulating pattern may directly contact a lower end of the spacer.

A first recessed area aligned between the spacer and the device isolation layer and on an upper region of the insulating pattern may be provided. The second gate electrode may extend into the first recessed area.

An interface between the insulating pattern and the spacer may be at a higher level than a lower end of the second gate electrode.

A second recessed area aligned with the second gate electrode and on an upper region of the device isolation layer may be provided. The second gate electrode may extend into the second recessed area.

A bottom of the first recessed area may be at a lower level than a bottom of the second recessed area.

In accordance with another aspect of the inventive concepts, another semiconductor device includes a device isolation layer configured to define an active area on a substrate. A first gate electrode configured to cross the active area. A second gate electrode configured to cross the device isolation layer. A gate dielectric layer configured to surround bottoms and side surfaces of the first gate electrode and the second gate electrode is formed. Spacers are on side surfaces of the first gate electrode and the second gate electrode. A trench is in the active area between the first gate electrode and the second gate electrode. A stressor is in the trench. A cavity is between the stressor and the device isolation layer and adjacent to the second gate electrode. An insulating pattern is in the cavity. The insulating pattern contacts a selected one of the spacers and the insulating pattern contacts the gate dielectric layer.

The gate dielectric layer may be between the spacers and the first and second gate electrodes. An upper end of the gate dielectric layer may be at a higher level than vertical centers of the first and second gate electrodes.

Upper ends of the gate dielectric layer, the spacers, and the first and second gate electrodes may be formed to have substantially the same plane.

A lower end of the second gate electrode may be at a lower level than a lower end of the first gate electrode.

The gate dielectric layer may be interposed between the insulating pattern and the second gate electrode. The insulating pattern may directly contact side surfaces of the stressor and the device isolation layer.

In accordance with still another aspect of the inventive concepts, another semiconductor device includes a device isolation layer configured to define an active area on a substrate. A plurality of gate electrodes cross the active area and the device isolation layer and spaced apart from each other. Spacers are on side surfaces of the gate electrodes. Trenches are in the active area between the gate electrodes. A semiconductor layer is in the trenches and different from the active area. Cavities between the semiconductor layer and the device isolation layer and aligned under the spacers are provided. An insulating pattern is in the cavities.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. In the drawings:

FIGS. 2 to 9 are enlarged cross-sectional views illustrating a part of FIG. 1 in detail;

DETAILED DESCRIPTION OF THE EMBODIMENTS

Figure 1:
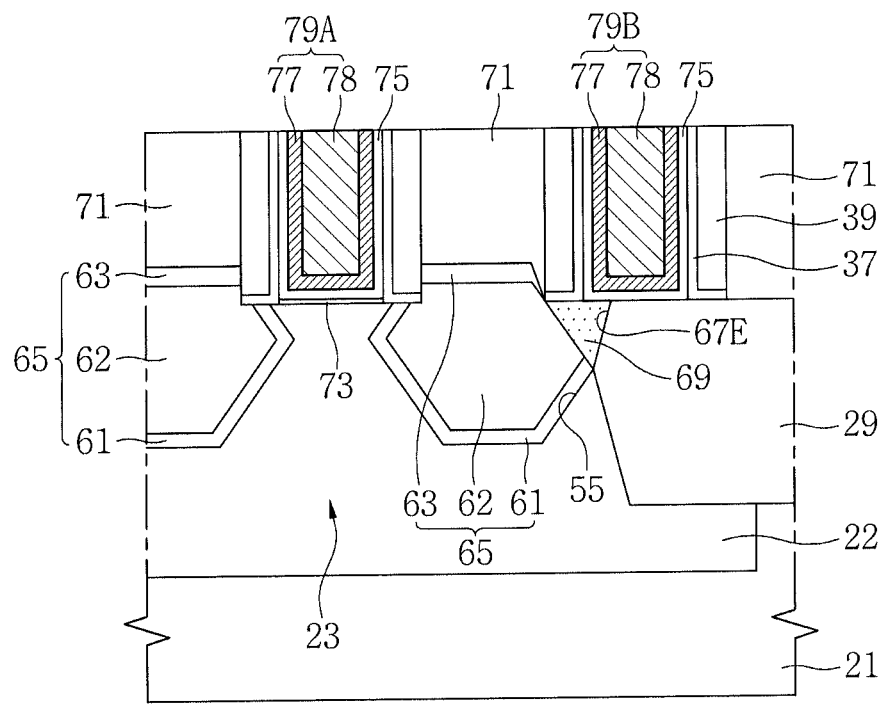
FIG. 1 is a cross-sectional view for describing a semiconductor device in accordance with embodiments of the inventive concepts.

The inventive concepts will now be described more fully with reference to the accompanying drawings to clarify aspects, features, and advantages of the present invention. The invention may, however, be embodied in many different forms and should not be construed as being limited to the embodiments set forth herein. Rather, these embodiments are provided so that this disclosure will be through and complete, and will fully convey the concepts of the invention to those of ordinary skill in the art. The present invention is defined by the appended claims.

The terminology used herein is for the purpose of illustrating particular embodiments only and is not intended to be limiting of the inventive concepts. As used herein, the singular forms "a", "an," and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

When one element (elements) is (are) "connected" or "coupled" to other element(s), this may indicate directly connected or coupled to the elements(s), or intervening elements may be present. Throughout the entire specification, the same reference numerals refer to the same components. The "and/or" includes each and all combinations of one or more of the items mentioned.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the present specification, relative terms, such as "front side" and "back side", may be used herein for ease of description to describe the inventive concepts. Accordingly, a front side or back side does not necessarily indicate a specific direction, location, or component but can be used interchangeably. For example, a front side could be interpreted as a back side, and a back side could be interpreted as a front side. Accordingly, a front side could be termed a first side, and a back side could be termed a second side. Conversely, a back side could be termed a first side, and a front side could be termed a second side. However, to avoid confusion, the terms "front side" and "back side" are not used in the same sense in any embodiment.

In the present specification, the term "near" indicates that any one of at least two components having symmetrical concepts is disposed nearer to another specific component than the others thereof. For instance, when a first end is near a first side, it may be inferred that the first end is nearer the first side than a second end or that the first end is nearer the first side than a second side.

FIG. 1 is a cross-sectional view for describing a semiconductor device in accordance with embodiments of the inventive concepts, and FIGS. 2 to 9 are enlarged cross-sectional views for describing a part of FIG. 1 in detail.

Figure 2:
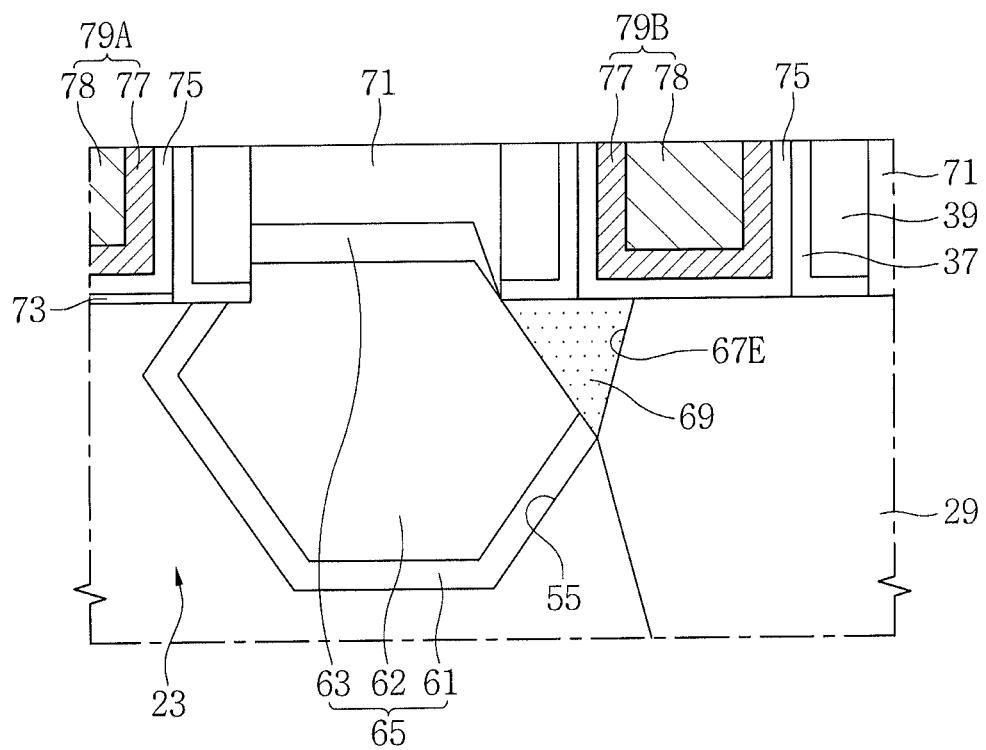

Referring to FIGS. 1 and 2, a well 22, an active area 23, a device isolation layer 29, a first gate dielectric layer 73, a second gate dielectric layer 75, a first gate electrode 79A, a second gate electrode 79B, first spacers 37, second spacers 39, trenches 55, stressors 65, an expanded cavity 67E, an insulating pattern 69, and an interlayer insulating layer 71 may be formed on a substrate 21. The insulating pattern 69 may be formed in the expanded cavity 67E. The insulating pattern 69 may include an insulating material such as, for example, silicon oxide, silicon nitride, silicon oxy-nitride, a metal oxide, or a combination thereof.

The first gate electrode 79A may be formed on the active area 23. The second gate electrode 79B may be formed on the device isolation layer 29. The second gate electrode 79B may be spaced apart from the first gate electrode 79A. The first gate electrode 79A may cross the active area 23. The second gate electrode 79B may cross the device isolation layer 29. The first spacers 37 and the second spacers 39 may be sequentially formed on side surfaces of the first gate electrode 79A and the second gate electrode 79B.

The second gate dielectric layer 75 may surround both side surfaces and bottoms of the first gate electrode 79A and the second gate electrode 79B. The second gate dielectric layer 75 may directly contact both the side surfaces and the bottoms of the first gate electrode 79A and the second gate electrode 79B according to an embodiment. The first gate dielectric layer 73 may be formed between the active area 23 and the second gate dielectric layer 75. The first gate dielectric layer 73 may directly contact the active area 23 according to an embodiment.

The trenches 55 may be formed in the active area 23 between the first gate electrode 79A and the second gate electrode 79B. The stressors 65 may be formed in the trenches 55. Upper ends of the stressors 65 may protrude at a higher level than an upper end of the active area 23. The upper ends of the stressors 65 may protrude at a higher level than a lower end of the first gate electrode 79A. The stressors 65 may have a sloped sidewall which depends on a crystalline orientation in the active area 23.

The expanded cavity 67E may be formed between the stressors 65 and the device isolation layer 29. The expanded cavity 67E may be formed under the first spacer 37 and the second spacer 39. The expanded cavity 67E may overlap the lower portion of the first spacer 37 and the second spacer 39. The expanded cavity 67E may be aligned with the lower end of the first spacer 37. The expanded cavity 67E may overlap the lower portion of the second gate electrode 79B.

According to an embodiment, the insulating pattern 69 may directly contact the stressors 65, the device isolation layer 29, the first spacers 37, and the second gate dielectric layer 75. The second gate dielectric layer 75 may directly contact both side surfaces and a bottom of the second gate electrode 79B and may directly contact both the insulating pattern 69 and the device isolation layer 29 according to an embodiment. An upper portion of the insulating pattern 69 may have a horizontal width greater than a lower portion thereof. The insulating pattern 69 may directly contact the sloped sidewalls of the stressors 65 according to an embodiment. The insulating pattern 69 may serve to block leakage currents between the stressor 65 and the second gate electrode 79B.

Referring to FIG. 3, the expanded cavity 67E may be formed between the stressors 65 and the device isolation layer 29. The expanded cavity 67E may expand between side surfaces of the active area 23 and the device isolation layer 29. An insulating pattern 69A may directly contact the stressors 65, the active area 23, the device isolation layer 29, the first spacers 37, and the second gate dielectric layer 75 according to an embodiment. The insulating pattern 69A may directly contact the side surface of the active area 23 according to an embodiment.

Referring to FIG. 4, a sidewall of the expanded cavity 67E may be formed roundly. An insulating pattern 69B may include a rounded side surface in direct contact with the device isolation layer 29 according to an embodiment.

Figure 5:
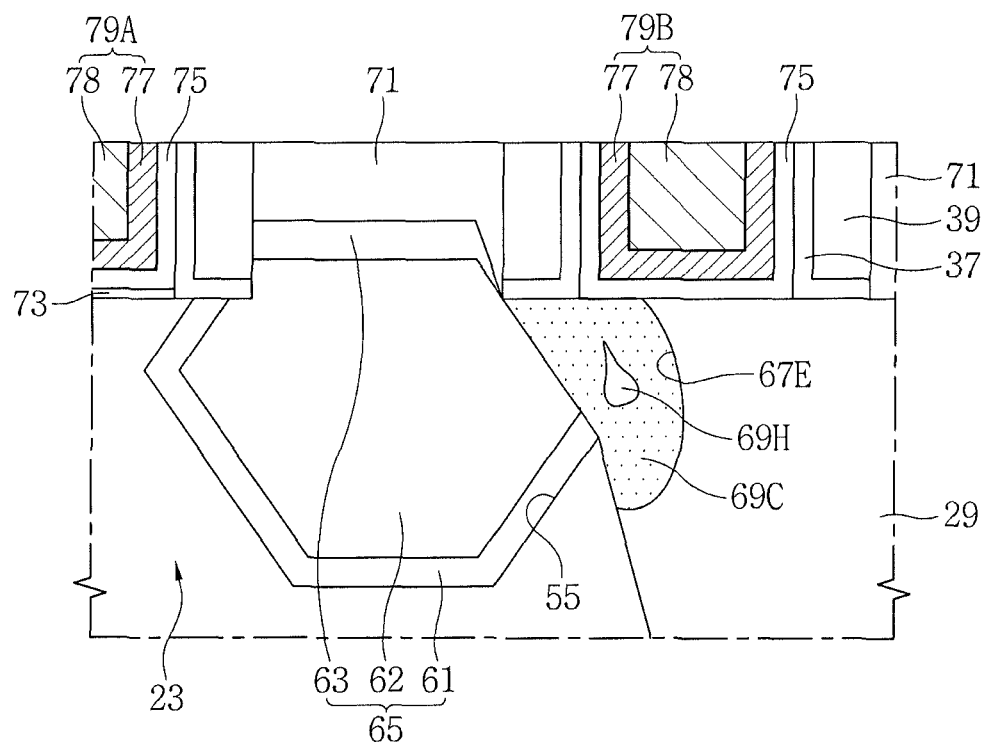

Referring to FIG. 5, an insulating pattern 69C may include an air gap 69H. The air gap 69H may be formed in the insulating pattern 69C.

In another embodiment, the air gap 69H may be formed in the expanded cavity 67E in various shapes at various locations.

Figure 6:
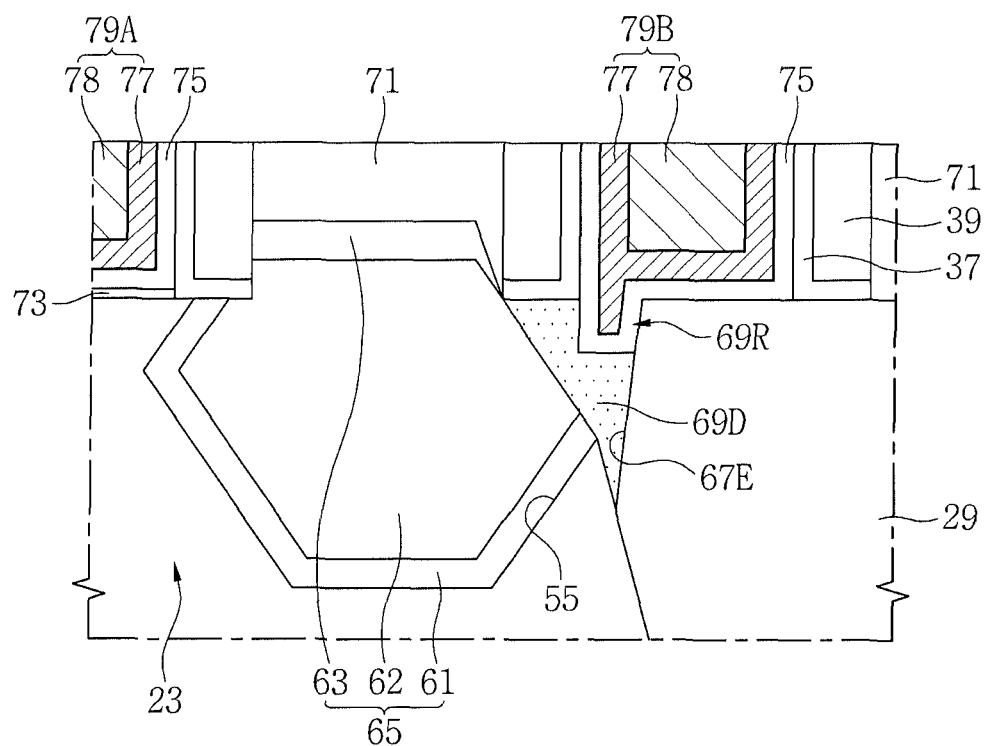

Referring to FIG. 6, a first recessed area 69R may be formed on an upper region of an insulating pattern 69D. The first recessed area 69R may be formed between first spacers 37 and a device isolation layer 29. A second gate dielectric layer 75 and second gate electrode 79B may extend into the first recessed area 69R. Lower ends of the second gate dielectric layer 75 and the second gate electrode 79B may be formed at lower levels than an interface between the insulating pattern 69D and the first spacers 37.

Figure 7:
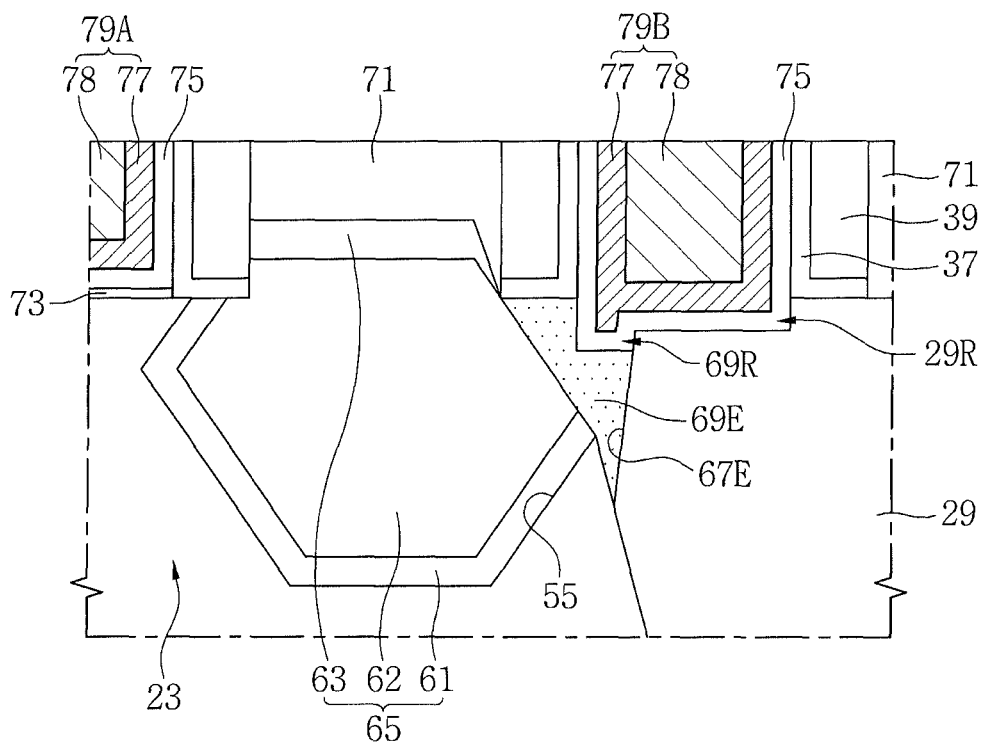

Referring to FIG. 7, a first recessed area 69R may be formed on an upper region of an insulating pattern 69E. A second recessed area 29R may be formed on an upper region of a device isolation layer 29. A bottom of the first recessed area 69R may be formed at a lower level than the second recessed areas 29R. A second gate dielectric layer 75 and a second gate electrode 79B may extend into the first recessed area 69R and the second recessed areas 29R. Bottoms of the second gate dielectric layer 75 and the second gate electrode 79B may be formed at lower levels than an interface between the device isolation layer 29 and first spacers 37.

Figure 8:
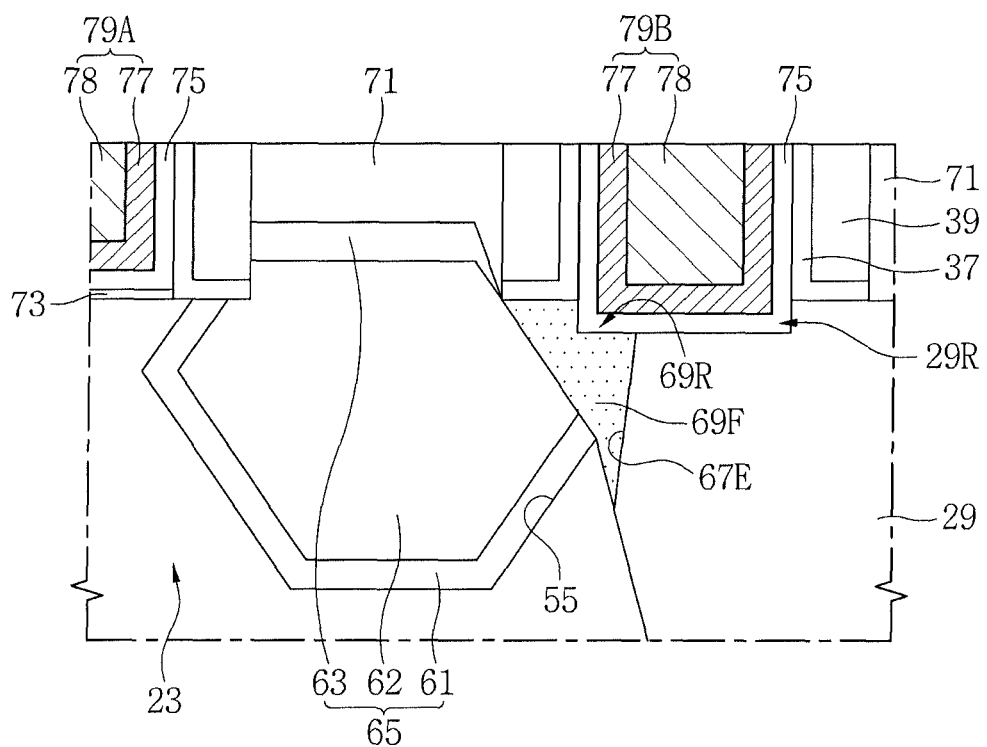

Referring to FIG. 8, a first recessed area 69R may be formed on an upper region of an insulating pattern 69F and a second recessed area 29R may be formed on an upper region of a device isolation layer 29. Bottoms of the first recessed area 69R and the second recessed areas 29R may have substantially the same level. Bottoms of a second gate dielectric layer 75 and a second gate electrode 79B may be formed at lower levels than an interface between a first gate dielectric layer 73 and an active area 23. Bottoms of the second gate electrode 79B may be formed at a lower level than a first gate electrode 79A.

Figure 9:
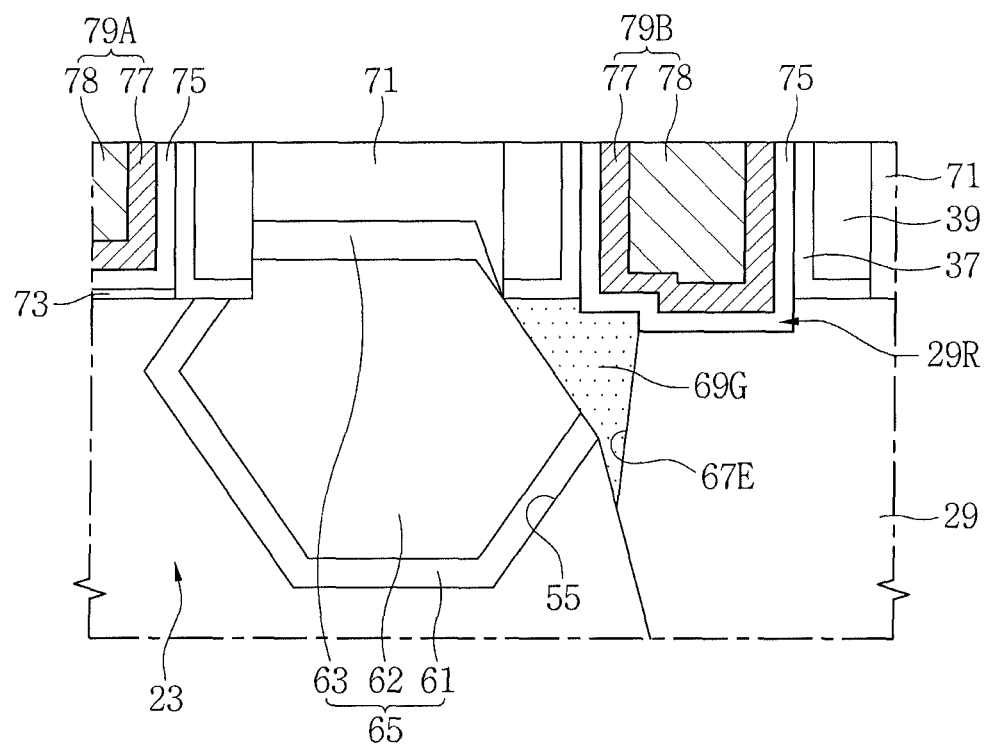

Referring to FIG. 9, an insulating pattern 69G may protrude more than an adjacent device isolation layer 29. A bottom of a second gate dielectric layer 75 may directly contact the insulating pattern 69G and the adjacent device isolation layer 29 according to an embodiment. An interface between the insulating pattern 69G and the second gate dielectric layer 75 may be formed at a higher level than an interface between the insulating pattern 69G and the adjacent device isolation layer 29.

Figure 10:
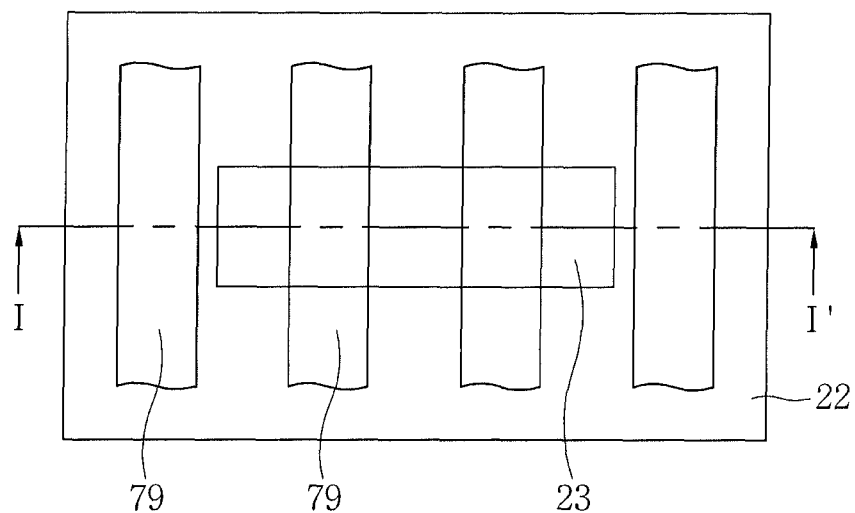
FIG. 10 is a layout for describing a semiconductor device in accordance with embodiments of the inventive concepts.

FIG. 10 is a layout for describing a semiconductor device in accordance with embodiments of the inventive concepts and FIGS. 11 to 28 are selected cross-sectional views taken along line I-I' of FIG. 10.

Figure 11:
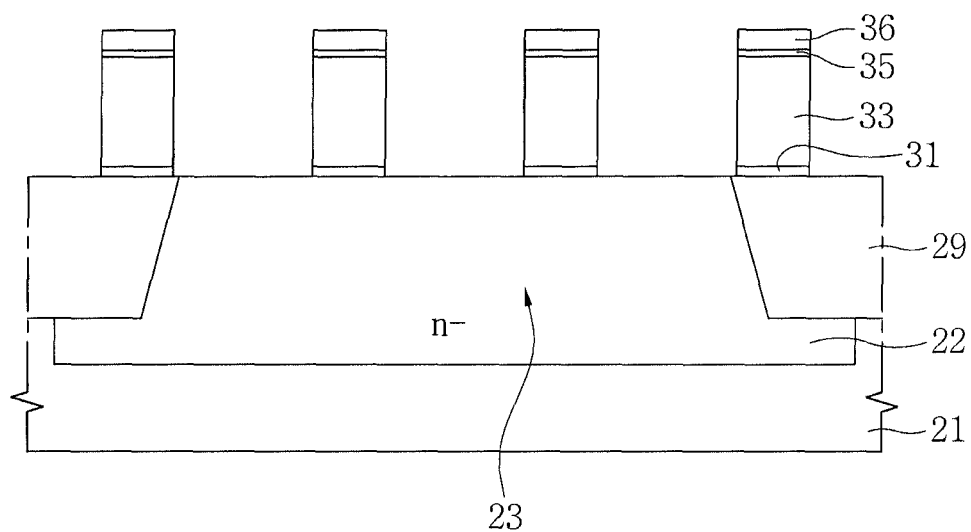
FIGS. 11 to 28 are cross-sectional views taken along line I-I' of FIG. 10 for describing a method of forming a semiconductor device in accordance with embodiments of the inventive concepts.

Referring to FIGS. 10 and 11, a well 22, an active area 23, a device isolation layer 29, a buffer layer 31, preliminary gate electrodes 33, a first mask pattern 35, and a second mask pattern 36 may be formed on a substrate 21. The substrate 21 may include a single crystalline semiconductor substrate such as a silicon wafer or a silicon-on-insulator (SOI) wafer. The substrate 21 may include first conductive impurities. The well 22 may include second conductive impurities that are different from the first conductive impurities.

Hereinafter, a case in which the first conductive is a P-type and the second conductive is an N-type will be described. For example, the substrate 21 may include single crystalline silicon having P-type impurities, and the well 22 may include single crystalline silicon having N-type impurities. The substrate 21 may include boron (B) and the well 22 may include arsenic (As), phosphorus (P), or a combination thereof.

In another embodiment, the first conductive may include an N-type and the second conductive may include a P-type.

The active area 23 in the well 22 may be defined by the device isolation layers 29. The active area 23 may include single crystalline silicon having N-type impurities. For example, the active area 23 may include arsenic (As), phosphorus (P), or a combination thereof. The device isolation layer 29 may be formed using a shallow trench isolation (STI) technique. The device isolation layer 29 may include an insulating layer such as silicon oxide, silicon nitride, silicon oxy-nitride, or a combination thereof. The plurality of active areas 23 may be formed to be spaced apart from each other in the well 22. The active area 23 may be formed in various shapes in the well 22. A side surface of the active area 23 may have a positive slope. A side surface of the device isolation layer 29 may have a negative slope.

The buffer layer 31 may be interposed between the active area 23 and the preliminary gate electrodes 33. The buffer layer 31 may include an insulating layer such as, for example, silicon oxide, silicon nitride, silicon oxy-nitride, or a combination thereof. For example, the buffer layer 31 may include silicon oxide. The preliminary gate electrodes 33 may be formed to cross the active area 23. The preliminary gate electrodes 33 may cross the active area 23 and the device isolation layer 29. The preliminary gate electrodes 33 may include polysilicon. In another embodiment, the preliminary gate electrodes 33 may include an insulating layer.

The first mask pattern 35 may be formed on the preliminary gate electrodes 33. The first mask pattern 35 may include a material having an etch selectivity with respect to the preliminary gate electrodes 33. The second mask pattern 36 may be formed on the first mask pattern 35. The second mask pattern 36 may include a material having an etch selectivity with respect to the first mask pattern 35. For example, the first mask pattern 35 may include silicon oxide and the second mask pattern 36 may include silicon nitride or polysilicon. Either the first mask pattern 35 or the second mask pattern 36 may be omitted.

Side surfaces of the second mask pattern 36, the first mask pattern 35, the preliminary gate electrode 33, and the buffer layer 31 may be vertically aligned. The second mask pattern 36, the first mask pattern 35, the preliminary gate electrode 33, and the buffer layer 31 may be referred to as preliminary gate patterns 36, 35, 33, and 31, respectively. The preliminary gate patterns 31, 33, 35, and 36 may cross the active area 23. The preliminary gate patterns 31, 33, 35, and 36 may cross the active area 23 and the device isolation layer 29. The plurality of preliminary gate patterns 31, 33, 35, and 36 may be formed to be parallel.

Figure 12:
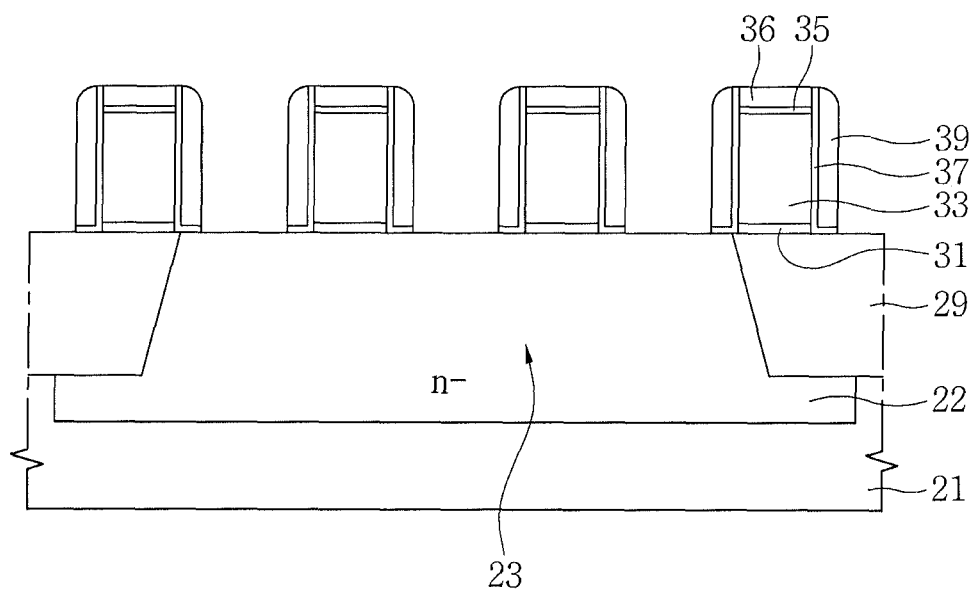

Referring to FIGS. 10 and 12, first spacers 37 and second spacers 39 may be formed on sidewalls of the preliminary gate electrode 33. The first spacers 37 and the second spacers 39 may be formed by a plurality of thin layer forming processes and a plurality of anisotropic etching processes. An upper surface of the active area 23 may be exposed to outsides of the preliminary gate electrode 33, the first spacers 37, and the second spacers 39.

Each of the first spacers 37 and the second spacers 39 may include an insulating layer such as, for example, silicon oxide, silicon nitride, silicon oxy-nitride, or a combination thereof. The first spacers 37 and the second spacers 39 may include a material having an etch selectivity with respect to the preliminary gate electrode 33. For example, the first spacers 37 and the second spacers 39 may include silicon nitride.

Figure 13:
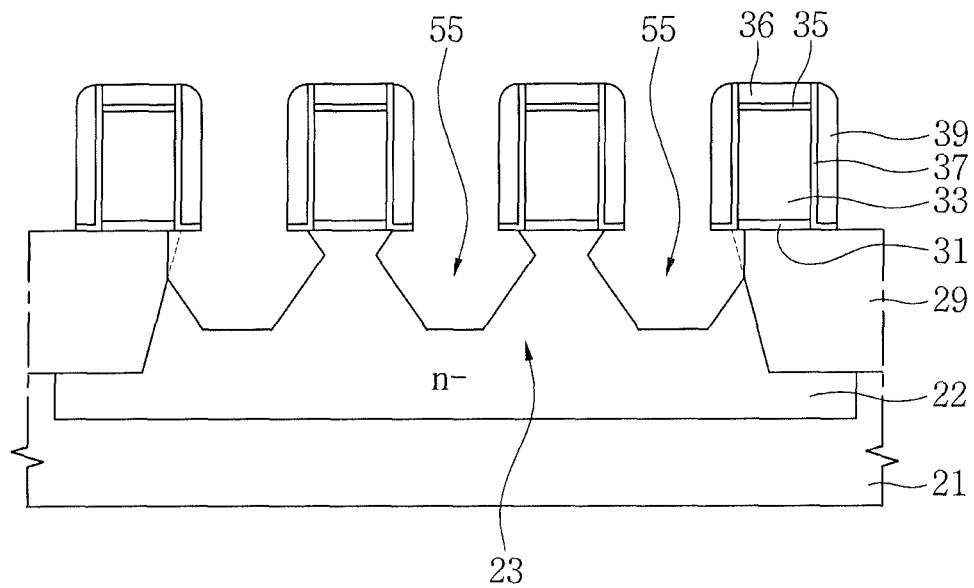

Referring to FIGS. 10 and 13, trenches 55 may be formed in the active area 23 adjacent to the preliminary gate electrodes 33. In the formation of the trenches 55, a directional etching process, an isotropic etching process, an anisotropic etching process, or a combination thereof may be applied.

For example, the trenches 55 may be formed by sequentially performing an isotropic etching process and a directional etching process. The isotropic etching process may be performed using HBr, $CF_4$, $O_2$, $Cl_2$, $NF_3$, or a combination thereof. A wet etching process using $NH_4OH$, $NH_3OH$, tetra methyl ammonium hydroxide (TMAH), KOH, NaOH, benzyltrimethylammonium hydroxide (BTMH), or a combination thereof may be applied to the directional etching process.

In another embodiment, the trenches 55 may be formed by sequentially performing an anisotropic etching process and a directional etching process.

The active area 23 and the device isolation layer 29 may be exposed in the trenches 55. Sidewalls of the trenches 55 may be understood as having a Σ-shape or a notch shape. The sidewalls of the trench 55 may be understood as having a convergence interface. The device isolation layer 29 may be partly removed while forming the trenches 55. Undercut regions may be formed under the first spacers 37 and the second spacers 39.

Figure 14:
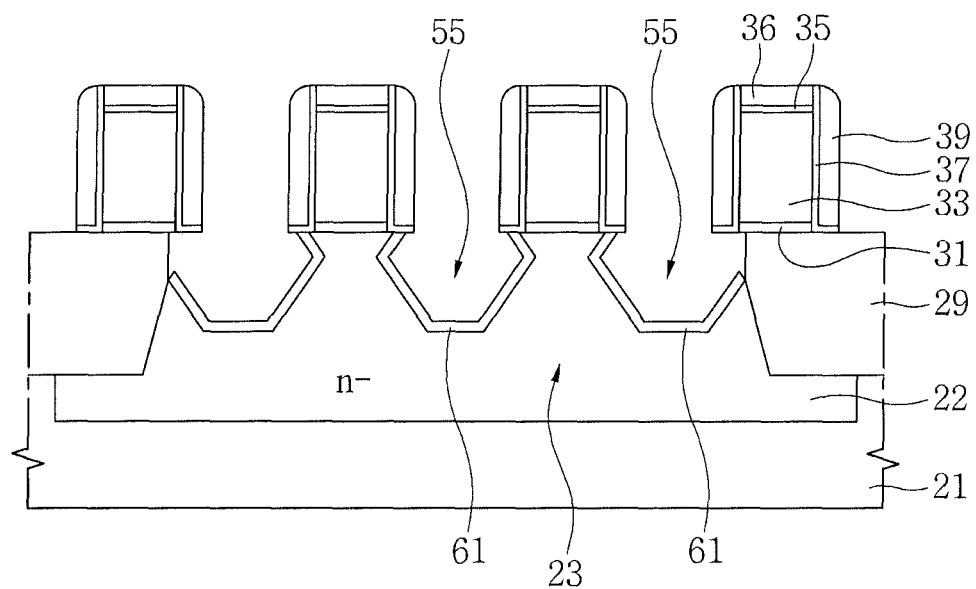

Referring to FIGS. 10 and 14, a first semiconductor layer 61 may be formed in the trenches 55. The first semiconductor layer 61 may include an undoped single crystalline SiGe by a selective epitaxial growth (SEG) method. The first semiconductor layer 61 may contain Ge in an amount of 10% to 25%. The first semiconductor layer 61 may conformally cover a surface of the active area 23 exposed in the trench 55. A side surface of the device isolation layer 29 may be exposed in the trenches 55.

Figure 15:
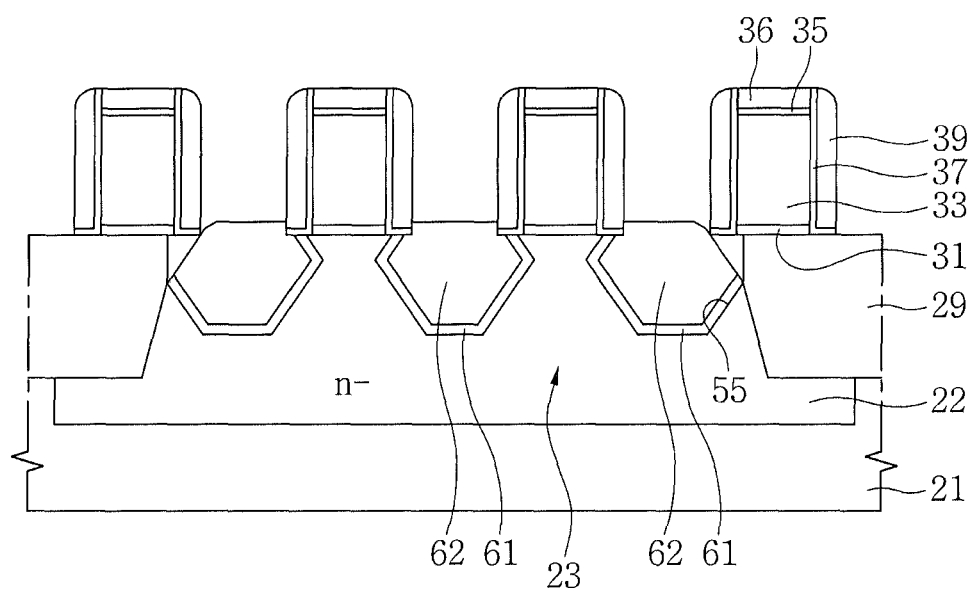

Referring to FIGS. 10 and 15, a second semiconductor layer 62 may be formed in the trenches 55. The second semiconductor layer 62 may include boron (B) doped single crystalline SiGe by a SEG method. The second semiconductor layer 62 may contain an amount of Ge greater than the first semiconductor layer 61. The second semiconductor layer 62 may contain Ge in an amount of 25% to 50%. The second semiconductor layer 62 may contain boron (B) in a range of 1E20 to 3E20 atom/$cm^3$. An upper end of the second semiconductor layer 62 may protrude at a higher level than the active area 23. The second semiconductor layer 62 may contact side surfaces of the first and second spacers 37 and 39.

Figure 16:
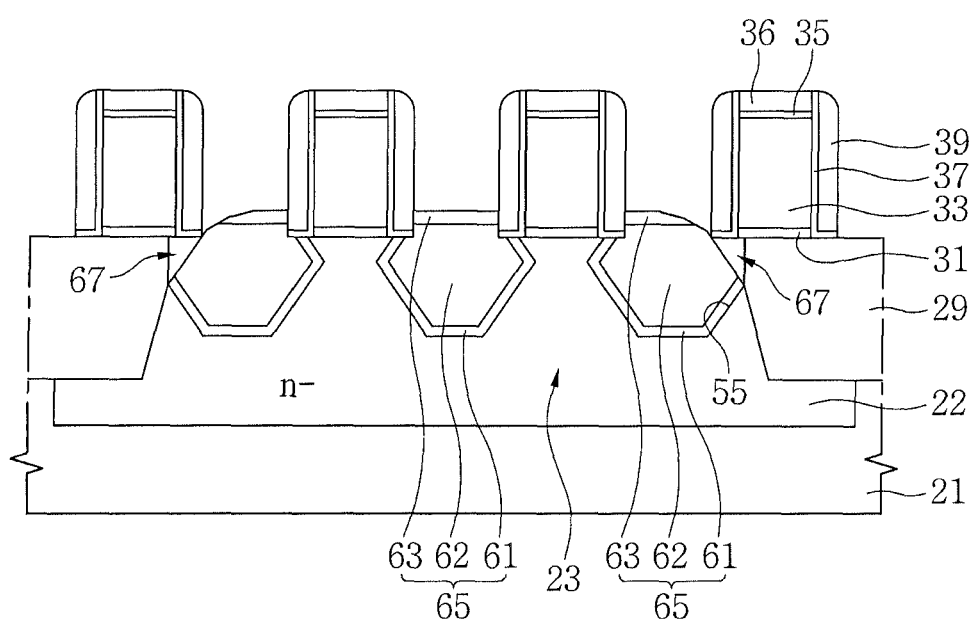

Referring to FIGS. 10 and 16, a third semiconductor layer 63 may be formed on the second semiconductor layer 62. The third semiconductor layer 63 may include boron (B) doped single crystalline Si or boron (B) doped single crystalline SiGe by a SEG method. The third semiconductor layer 63 may contain an amount of Ge less than the second semiconductor layer 62. The third semiconductor layer 63 may include the contained amount of Ge less than 10%. The third semiconductor layer 63 may contain boron (B) in a range of 1E20 to 3E20 atom/$cm^3$. The first semiconductor layer 61, the second semiconductor layer 62, and the third semiconductor layer 63 may form stressor 65. The stressor 65 may be referred to as a strain-inducing pattern. The third semiconductor layer 63 may be referred to as a capping layer.

In another embodiment, the first semiconductor layer 61 may be omitted.

The stressor 65 may include a sloped side surface depending on a crystalline direction of the active area 23 exposed in the trench 55. A cavity 67 may be formed between the stressor 65 and the device isolation layer 29. The cavity 67 may be formed under lower portions of the first spacer 37 and the second spacer 39. The first spacer 37, the stressor 65, and the device isolation layer 29 may be exposed in the cavity 67.

In another embodiment, the buffer layer 31, the first spacer 37, the stressor 65, and the device isolation layer 29 may be exposed in the cavity 67.

Figure 17:
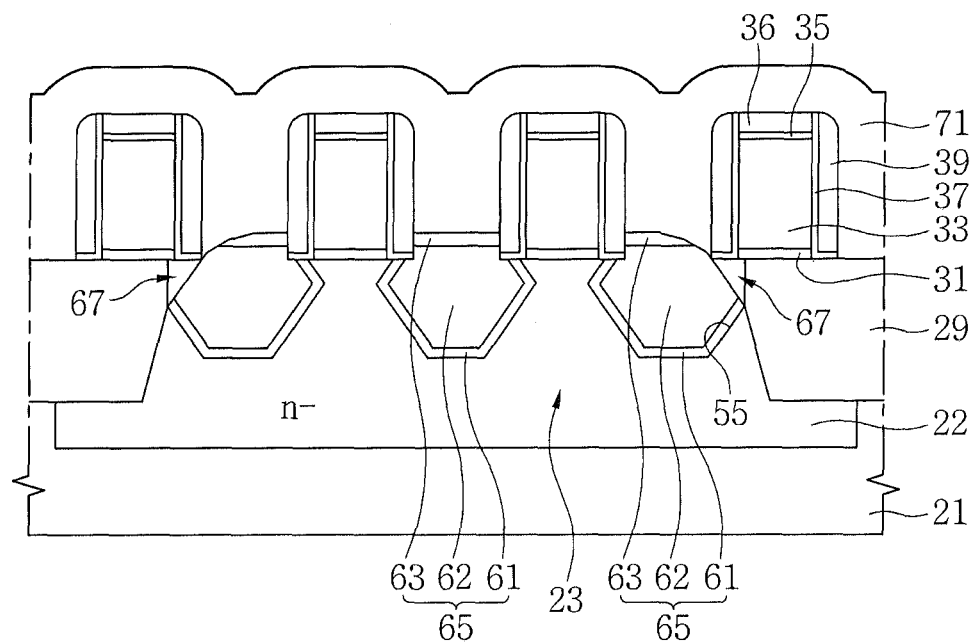

Referring to FIGS. 10 and 17, an interlayer insulating layer 71 may be formed on the substrate 21. The interlayer insulating layer 71 may include an insulating layer such as, for example, silicon oxide, silicon nitride, silicon oxynitride, or a combination thereof.

In another embodiment, before forming the interlayer insulating layer 71, some processes such as a metal silicide forming process, a thermal processing process, and the like may be additionally performed on the third semiconductor layer 63.

Figure 18:
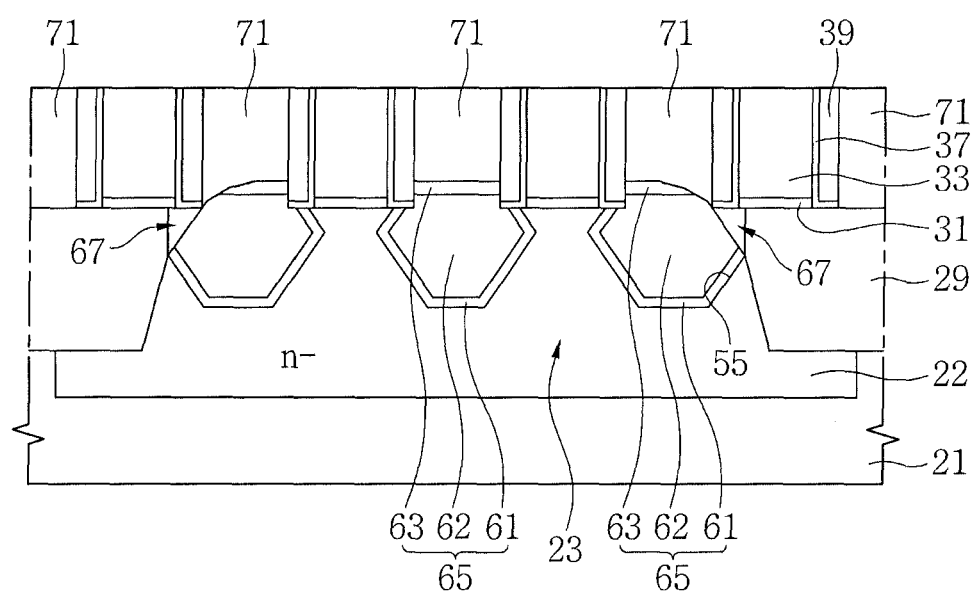

Referring to FIGS. 10 and 18, the preliminary gate electrodes 33 may be exposed by partly removing the interlayer insulating layer 71 and both the second mask patterns 36 and the first mask patterns 35. In the removal of the interlayer insulating layer 71, the second mask pattern 36 and the first mask pattern 35, a chemical mechanical polishing (CMP) process, an etch-back process, or a combination thereof may be applied. The interlayer insulating layer 71 may remain on the third semiconductor layer 63.

Figure 19:
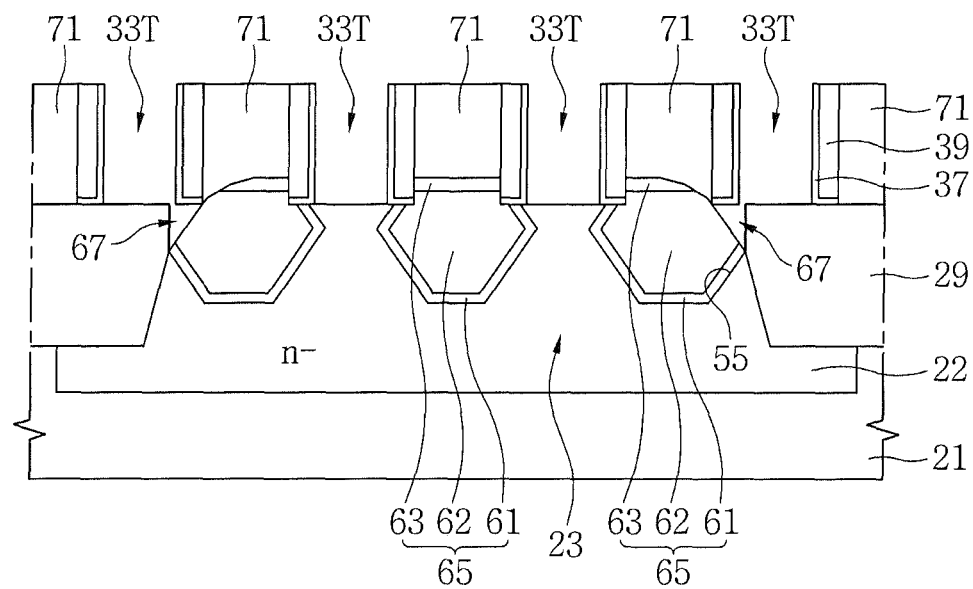

Referring to FIGS. 10 and 19, gate trenches 33T which expose both of the active area 23 and the device isolation layer 29 may be formed after removing the preliminary gate electrodes 33 and the buffer layer 31. The gate trench 33T may be communicated with the cavity 67.

Figure 20:
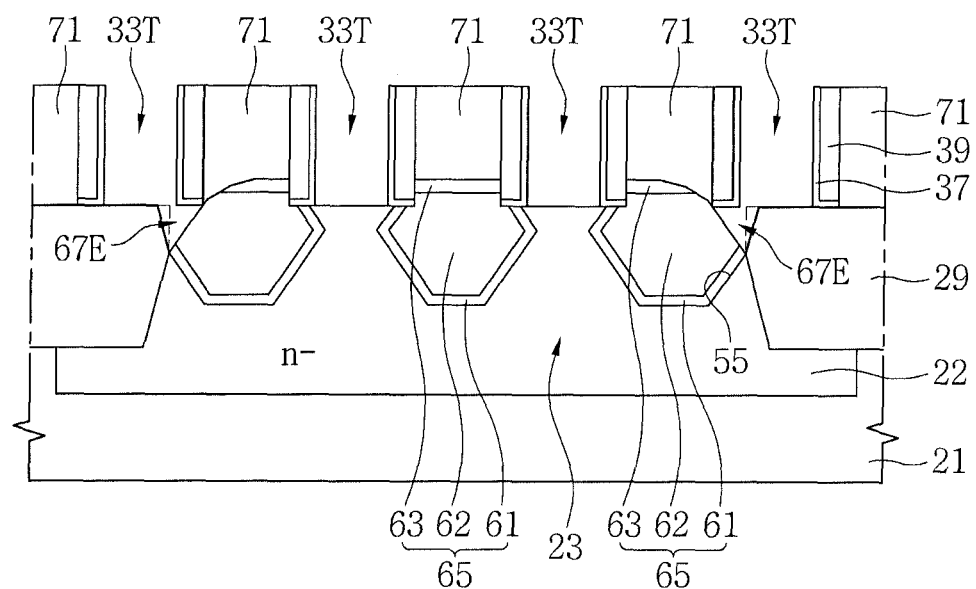

FIGS. 21 to 24 are enlarged views illustrating a part of FIG. 20 in detail.

Figure 21:
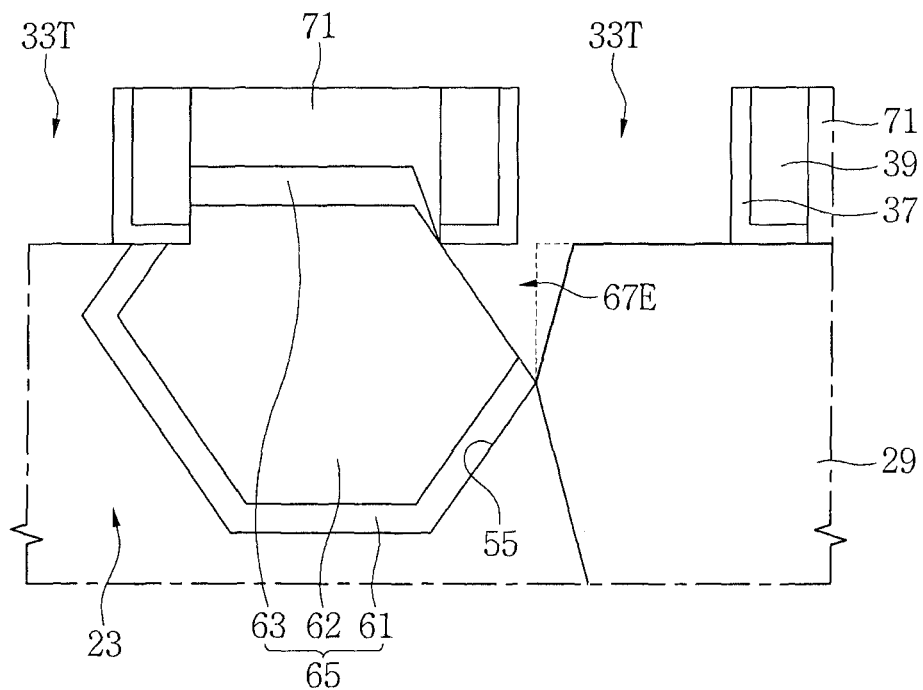

Referring to FIGS. 10, 20, and 21, an expanded cavity 67E may be formed by expanding the cavity 67. A dry etching process, a wet cleaning process, or a combination thereof may be applied to expand the cavity 67. $NH_3$, $NF_3$, plasma, or a combination thereof may be used in the dry etching process. HF, BOE, or a combination thereof may be used in the wet cleaning process. The first semiconductor layer 61, the second semiconductor layer 62, the first spacer 37, and the device isolation layer 29 may be exposed in the expanded cavity 67E. An upper portion of the expanded cavity 67E may have a horizontal width greater than a lower portion thereof.

Figure 22:
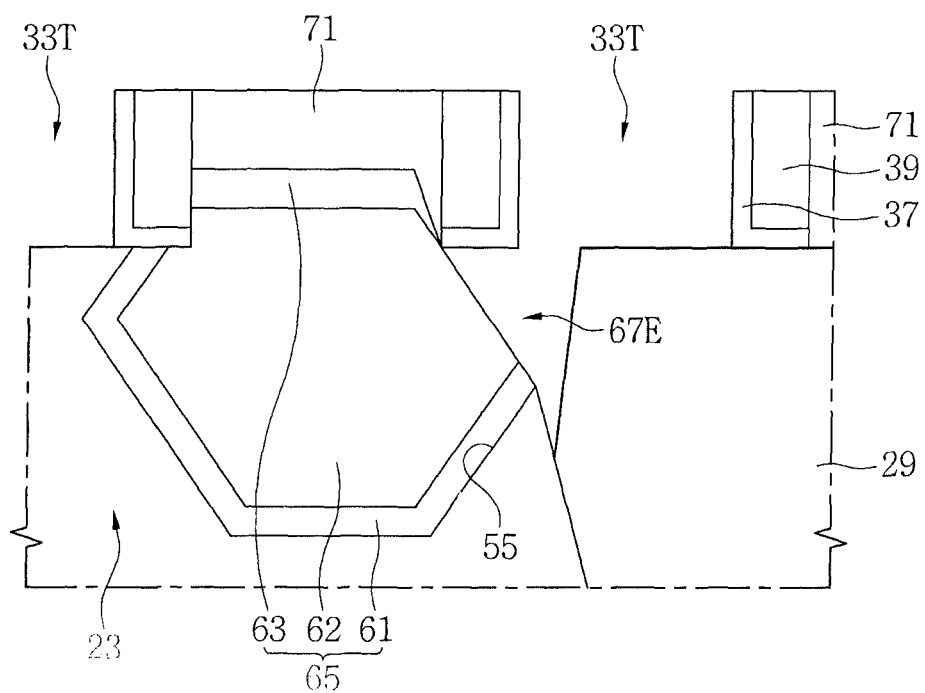

Referring to FIG. 22, the active area 23, the first semiconductor layer 61, the second semiconductor layer 62, the first spacer 37, and the device isolation layer 29 may be exposed in the expanded cavity 67E.

Figure 23:
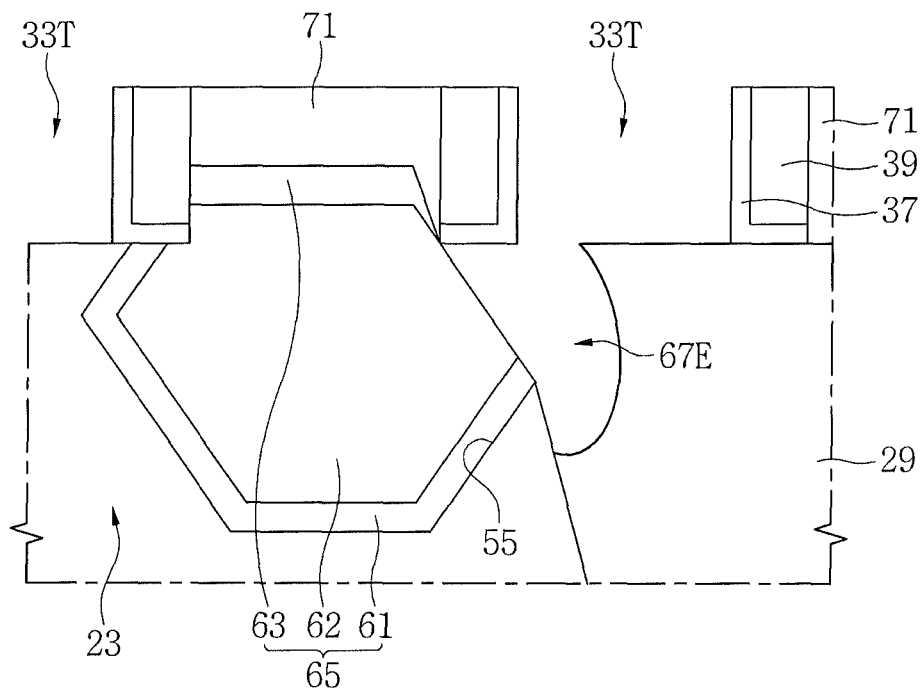

Referring to FIG. 23, due to a recess of the device isolation layer 29, a sidewall of the expanded cavity 67E may be roundly formed.

Figure 24:
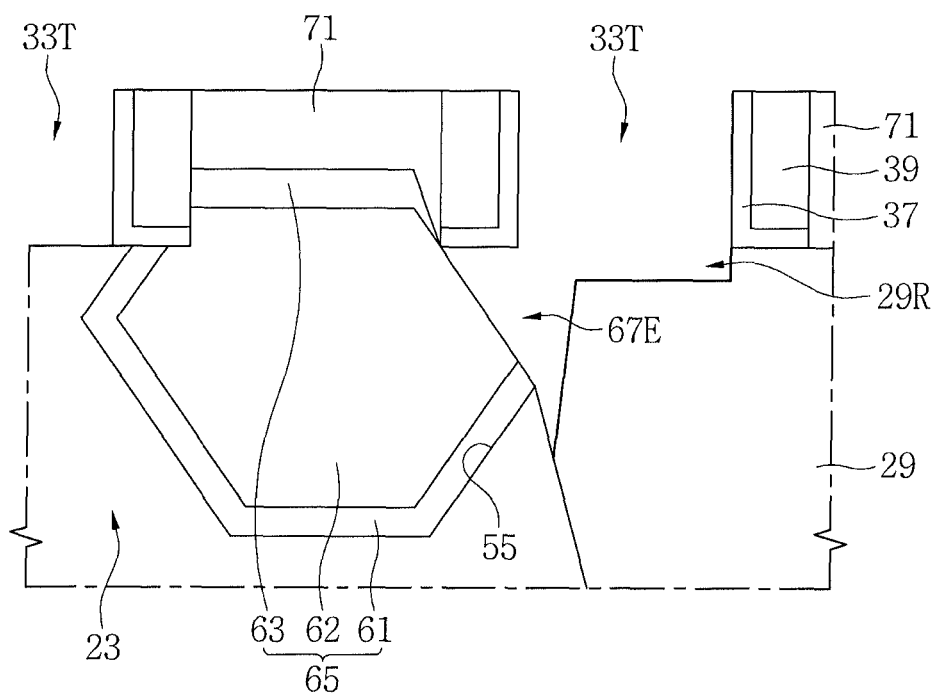

Referring to FIG. 24, a recessed area 29R may be formed on an upper end of the device isolation layer 29. The recessed area 29R may be formed by a process of removing the buffer layer 31 or a process of expanding the cavity 67. The recessed area 29R may be aligned under the gate trench 33T. An interface between the device isolation layer 29 and the first spacer 37 may be formed at a higher level than a bottom of the recessed area 29R.

Figure 25:
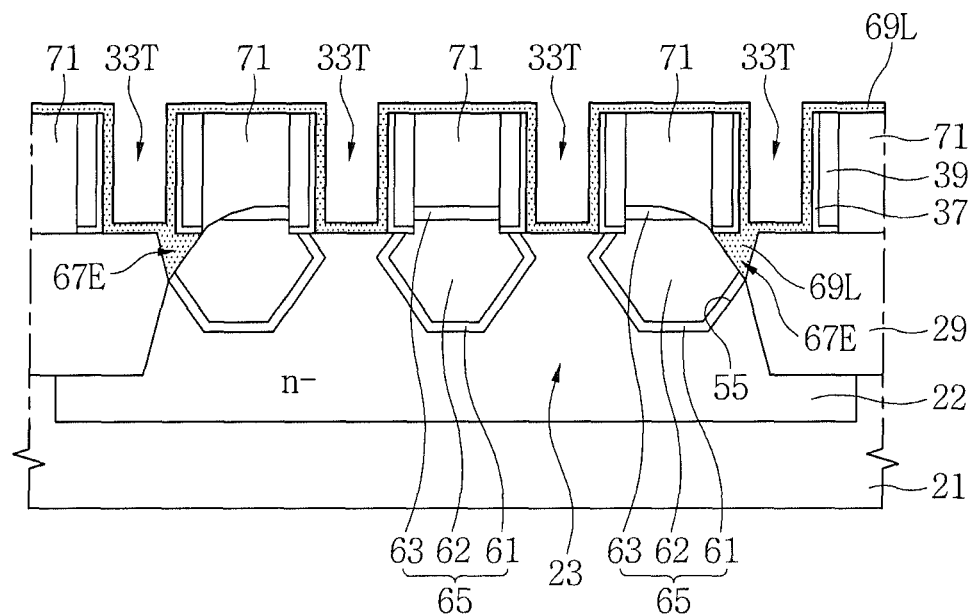

Referring to FIGS. 10 and 25, an insulating layer 69L may be formed to fill the expanded cavity 67H and conformally cover the substrate 21. The insulating layer 69L may include, for example, silicon oxide, silicon nitride, silicon oxy-nitride, a metal oxide, or a combination thereof.

Figure 26:
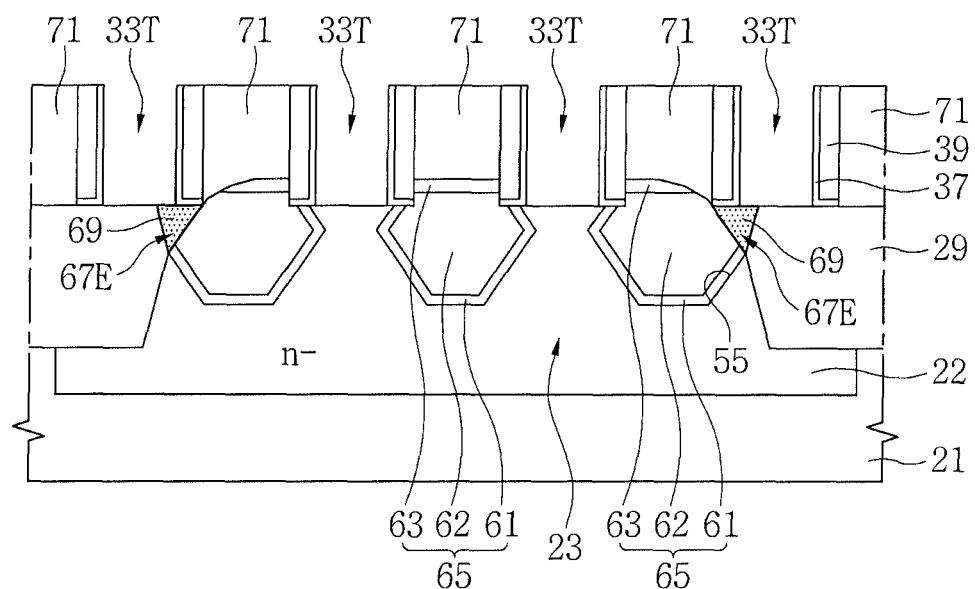

Referring to FIGS. 10 and 26, an insulating pattern 69 may be formed by partly removing the insulating layer 69L through an etch-back process. The insulating pattern 69 may remain in the expanded cavity 67E.

Figure 27:
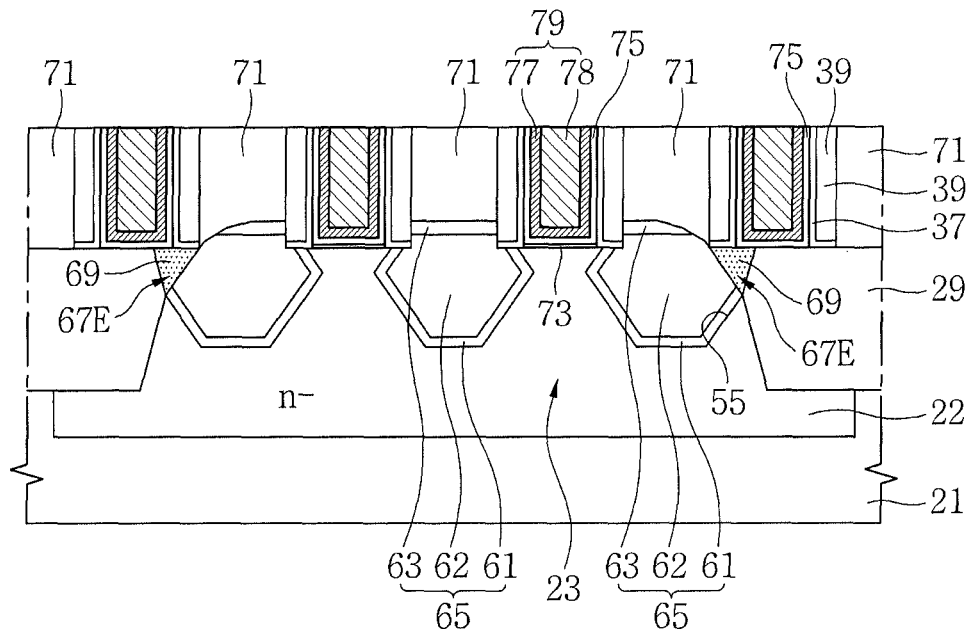

Referring to FIGS. 10 and 27, a first gate dielectric layer 73, a second gate dielectric layer 75, lower gate electrode 77, and upper gate electrodes 78 may be formed in the gate trenches 33T. The lower gate electrodes 77 and the upper gate electrodes 78 may form gate electrodes 79.

The first gate dielectric layer 73 may be formed on the active area 23. The first gate dielectric layer 73 may be referred to as an interface oxide layer. For example, the first gate dielectric layer 73 may include a chemical oxide. The first gate dielectric layer 73 may be formed by a cleaning process. The first gate dielectric layer 73 may be formed by a reaction of silicon of the active area 23 and hydrogen peroxide $H_2O_2$ in a cleaning solution.

The second gate dielectric layer 75 may include, for example, silicon oxide, silicon nitride, silicon oxy-nitride, high-K dielectrics, or a combination thereof. For example, the second gate dielectric layer 75 may include HfO or HfSiO. The second gate dielectric layer 75 may surround side surfaces and bottoms of the lower gate electrode 77. An upper end of the second gate dielectric layer 75 may be formed at a higher level than a vertical center of the gate electrode 79. A bottom of the second gate dielectric layer 75 may directly contact the device isolation layer 29 and the insulating pattern 69 according to an embodiment.

The first gate dielectric layer 73 may be interposed between the active area 23 and the second gate dielectric layer 75. The first gate dielectric layer 73 may directly contact the active area 23 and the second gate dielectric layer 75 according to an embodiment.

The lower gate electrode 77 may surround side surfaces and bottoms of the upper gate electrode 78. The lower gate electrode 77 may include a conduction layer having a work-function. For example, the lower gate electrode 77 may include TiN or TaN. The upper gate electrode 78 may include a metal layer such as tungsten (W).

In another embodiment, the lower gate electrode 77 may include TiAl or TiAlC.

Upper ends of the interlayer insulating layer 71, the first spacer 37, the second spacer 39, the second gate dielectric layer 75, and the gate electrode 79 may be exposed in substantially the same plane.

Figure 28:
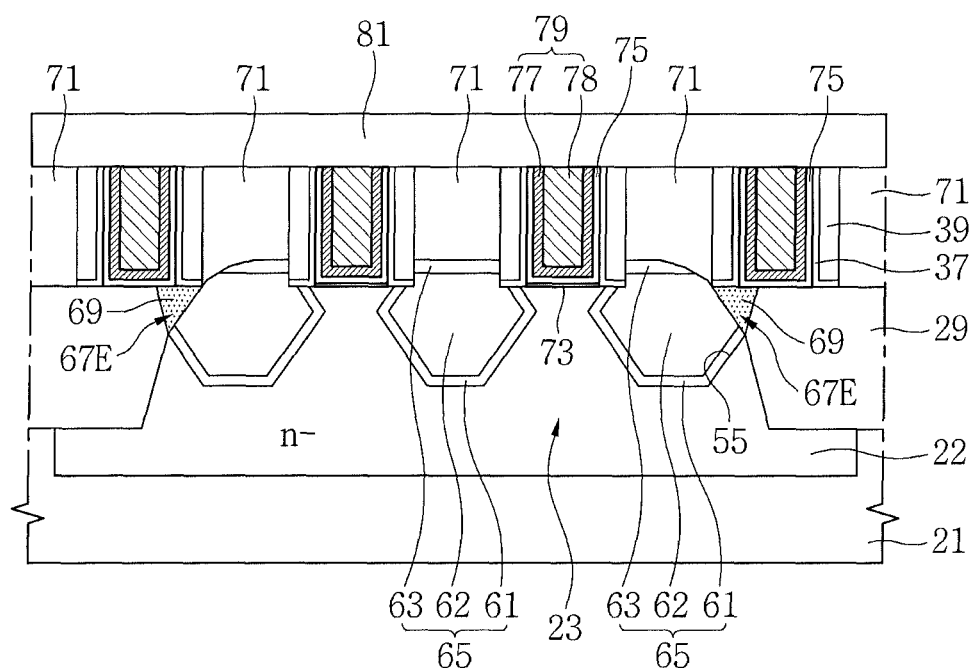

Referring to FIGS. 10 and 28, an upper insulating layer 81 may be formed on the interlayer insulating layer 71. The upper insulating layer 81 may cover the first spacers 37, the second spacers 39, the second gate dielectric layer 75, and the gate electrodes 79. The upper insulating layer 81 may include, for example, silicon oxide, silicon nitride, silicon oxy-nitride, low-K dielectrics, or a combination thereof.

Figure 29:
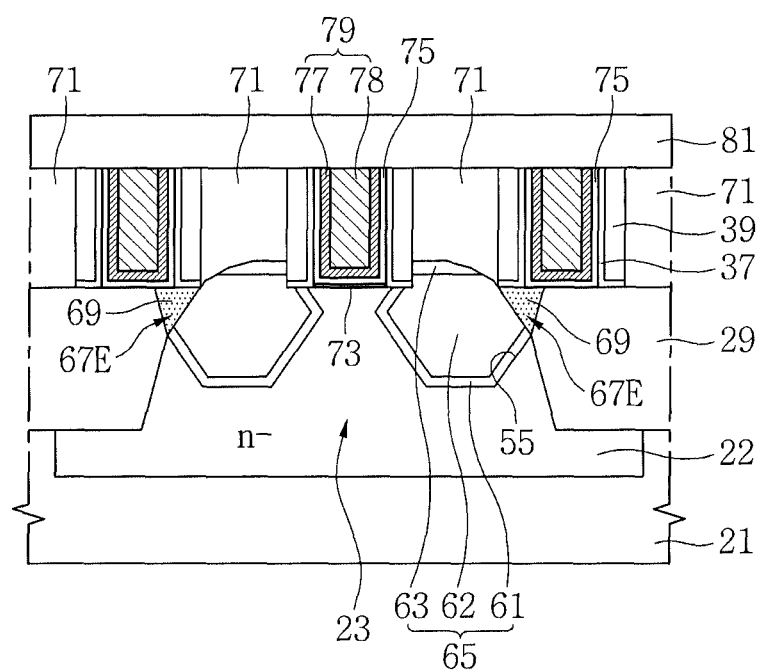
FIG. 29 is a cross-sectional view for describing a semiconductor device in accordance with embodiments of the inventive concepts.

FIG. 29 is a cross-sectional view for describing a semiconductor device in accordance with an embodiment of the inventive concepts.

Referring to FIG. 29 a device isolation layer 29, a plurality of gate electrodes 79 spaced apart from each other, first and second spacers 37 and 39, a pair of stressors 65, a pair of insulating patterns 69, an interlayer insulating layer 71, and an upper insulating layer 81 may be formed on a substrate 21. Each of the insulating patterns 69 may be formed in expanded cavities 67E.

Figure 30:
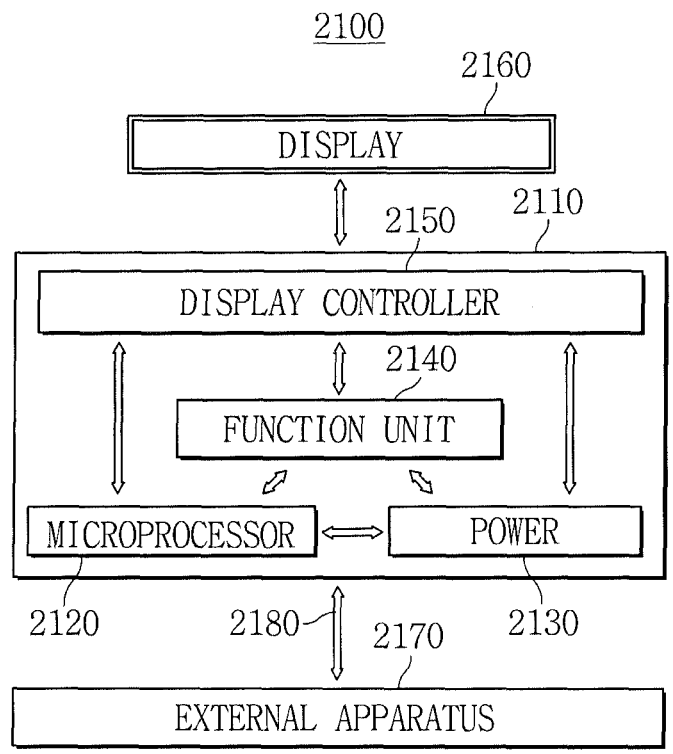
FIGS. 30 and 31 are system block diagrams of electronic devices in accordance with embodiments of the inventive concepts.
Figure 31:
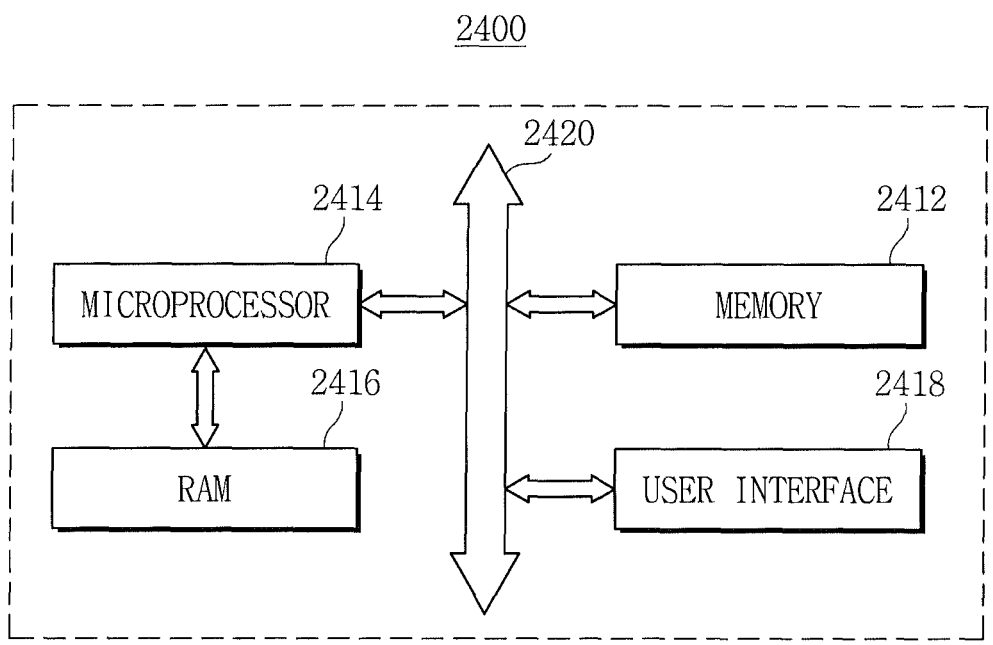

FIGS. 30 and 31 are system block diagrams of electronic device in accordance with embodiment of the inventive concepts.

Referring to FIG. 30, a semiconductor device similar to descriptions with reference to FIGS. 1 to 29 may apply to an electronic system 2100. The electronic system 2100 may include a body 2110, a microprocessor 2120, a power 2130, a function unit 2140, and a display controller 2150. The body 2110 may include a motherboard formed with a printed circuit board (PCB). The body 2110 may include the microprocessor 2120, the power 2130, the function unit 2140, and the display controller 2150. A display 2160 may be disposed inside the body 2110 or outside the body 2110. For example, the display 2160 may be disposed on a surface of the body 2110 and display an image processed by the display controller 2150.

The power 2130 may receive a predetermined voltage from an external battery, divide the predetermined voltage into required voltage levels, and serve to supply the voltages to the microprocessor 2120, the function unit 2140, and the display controller 2150. The microprocessor 2120 may receive a voltage from the power 2130 and control the function unit 2140 and the display 2160. The function unit 2140 may perform various functions of the electronic system 2100. For example, when the electronic system 2100 is a smart phone, the function unit 2140 may include a dialing or various components to perform mobile functions such as an image output to the display 2160 or an audio output to a speaker from communication with an external apparatus 2170, and the function unit 2140 may also serve as a camera image processor when a camera is mounted on the smart phone.

According to an application embodiment, when the electronic system 2100 includes a memory card or the like to expand a storage capacity, the function unit 2140 may serve as a memory card controller. The function unit 2140 may exchange a signal with the external apparatus 2170 via either a wired or wireless communication unit 2180. Furthermore, when the electronic system 2100 needs a Universal Serial Bus (USB) or the like to expand functions, the function unit 2140 may serve as an interface controller. In addition, the function unit 2140 may include a mass capacity storage unit.

A semiconductor device similar to descriptions with reference to FIGS. 1 to 29 may apply to the function unit 2140 or the microprocessor 2120. For example, the microprocessor 2120 may include the stressor 65 and the insulating pattern 69.

Referring to FIG. 31, an electronic system 2400 may include at least one of the semiconductor devices according to the embodiments of the inventive concepts. The electronic system 2400 may be used for manufacturing a mobile device or a computer. For example, the electronic system 2400 may include a memory system 2412, a microprocessor 2414, a RAM 2416, a bus 2420, and a user interface 2418. The microprocessor 2414, the memory system 2412, and the user interface 2418 may mutually connect via the bus 2420. The user interface 2418 may be used for a data input to the electronic system 2400 or a data output from the electronic system 2400. The microprocessor 2414 may program and control the electronic system 2400. The RAM 2416 may be used as an operational memory of the microprocessor 2414. The microprocessor 2414, the RAM 2416 and/or other components may be assembled in a single package. The memory system 2412 may store operational codes of the microprocessor 2414, data processed by the microprocessor 2414, or externally input data. The memory system 2412 may include a controller and a memory.

A semiconductor device similar to descriptions with reference to FIG. 1 to FIG. 29 may apply to the microprocessor 2414, the RAM 2416, or the memory system 2412

In accordance with embodiments of the inventive concepts, an insulating pattern is formed in a cavity between a stressor and a device isolation layer in a semiconductor device. A gate electrode is formed on the device isolation layer. The insulating pattern can serve to block a leakage current between the gate electrode and the stressor. The semiconductor device can have an advantage of high integration and excellent electrical characteristics compared to conventional semiconductor devices.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
a device isolation layer defining an active area on a substrate;
a first gate electrode on the active area;
a second gate electrode on the device isolation layer;
a spacer on a side surface of the second gate electrode;
a trench in the active area between the first gate electrode and the second gate electrode;
a stressor in the trench, the stressor comprising a first semiconductor layer formed along a sidewall of the stressor and a second semiconductor layer formed within the trench on the first semiconductor layer;
a cavity between the stressor and the device isolation layer and adjacent to the second gate electrode; and
an insulating pattern in the cavity,
wherein the insulating pattern is disposed between the spacer and the stressor and between the second gate electrode and the device isolation layer to vertically overlap a lower portion of the second gate electrode.

2. The semiconductor device according to claim 1, wherein the stressor further comprises a third semiconductor layer formed on the second semiconductor layer, and
wherein the first semiconductor layer contains a first amount of Ge and the second semiconductor layer contains a second amount of Ge that is greater than the first amount of Ge and the third semiconductor layer contains a third amount of Ge that is less than the first amount of Ge.

3. The semiconductor device according to claim 1, wherein the insulating pattern directly contacts a side surface of the stressor and the device isolation layer.

4. The semiconductor device according to claim 1, wherein the insulating pattern includes an air gap.

5. The semiconductor device according to claim 1, wherein the cavity expands between the active area and the device isolation layer.

6. The semiconductor device according to claim 5, wherein the insulating pattern directly contacts a side surface of the active area.

7. The semiconductor device according to claim 1, wherein an upper portion of the insulating pattern has a width greater than a lower portion thereof.

8. The semiconductor device according to claim 1, further comprising:
a gate dielectric layer under the second gate electrode,
wherein an interface between the insulating pattern and the gate dielectric layer is at a higher level than an interface between the insulating pattern and the device isolation layer.

9. The semiconductor device according to claim 1, wherein the insulating pattern overlaps the spacer.

10. The semiconductor device according to claim 9, wherein the insulating pattern directly contacts a lower end of the spacer.

11. The semiconductor device according to claim 9, further comprising:
a first recessed area aligned between the spacer and the device isolation layer and on an upper region of the insulating pattern,
wherein the second gate electrode extends into the first recessed area.

12. The semiconductor device according to claim 11, wherein an interface between the insulating pattern and the spacer is at a higher level than a lower end of the second gate electrode.

13. The semiconductor device according to claim 1, wherein the stressor further comprises a third semiconductor layer formed on the second semiconductor layer, and
wherein a bottom of the third semiconductor layer is disposed at a level equal to or higher than an upper end of the active area.

14. A semiconductor device, comprising:
a plurality of device isolation layers defining an active area on a substrate;
a plurality of gate electrodes crossing the active area and the device isolation layer;
spacers on side surfaces of each of the plurality of gate electrodes;
trenches in the active area on either side of the gate electrodes crossing the active area;
a stressor in each trench, each stressor comprising a first semiconductor layer formed along a sidewall of the stressor, a second semiconductor layer formed within the trench on the first semiconductor layer and a third semiconductor layer formed on the second semiconductor layer, the first, second and third-semiconductor layers being different from each other;
a cavity between the second semiconductor layer of each trench and the device isolation layer, and aligned under the spacers; and
an insulating pattern in the cavity, the insulating pattern being disposed at least partially under a lower portion of an adjacent gate electrode,
wherein the insulating pattern is disposed between the spacer on the side surface of one of the plurality of gate electrodes and the stressor and between the one of the plurality of gate electrodes and the device isolation layer to vertically overlap a lower portion of the one of the plurality of gate electrodes, and
wherein a bottom of the third semiconductor layer is disposed at a level equal to or higher than an upper end of the active area.

15. A semiconductor device, comprising:
a device isolation layer defining an active area on a substrate;
a first gate electrode crossing the active area;
a second gate electrode crossing the device isolation layer;
a first gate dielectric layer surrounding bottoms and side surfaces of the first gate electrode;
a second gate dielectric layer surrounding bottoms and side surfaces of the second gate electrode;
spacers on the side surfaces of the first gate electrode and the second gate electrode;
a trench in the active area between the first gate electrode and the second gate electrode;
a stressor in the trench, the stressor comprising a first semiconductor layer formed along a sidewall of the stressor, a second semiconductor layer formed within the trench on the first semiconductor layer and a third semiconductor layer formed on the second semiconductor layer;
a cavity between the stressor and the device isolation layer and adjacent to the second gate electrode; and
an insulating pattern in the cavity,
wherein the insulating pattern is disposed between the spacer on the side surface of the second gate electrode and the stressor and between the second gate electrode and the device isolation layer to vertically overlap a lower portion of the second gate electrode;
wherein the insulating pattern contacts at least one of the spacers and the second gate dielectric layer, and
wherein the first semiconductor layer contains a first amount of Ge and the second semiconductor layer contains a second amount of Ge that is greater than the first amount of Ge and the third semiconductor layer contains a third amount of Ge that is less than the first amount of Ge.

16. The semiconductor device according to claim 15, wherein the first gate dielectric layer is between the spacers and the first gate electrode;
the second gate dielectric layer is between the spacers and second gate electrode;
an upper end of the first gate dielectric layer is at a higher level than a vertical center of the first gate electrode; and
an upper end of the second gate dielectric layer is at a higher level than a vertical center of the second gate electrode.

17. The semiconductor device according to claim 15, wherein upper ends of the gate dielectric layer, the spacer, the first gate electrode, and the second gate electrode are formed to have a substantially same plane.

18. The semiconductor device according to claim 15, wherein a lower end of the second gate electrode is at a lower level than a lower end of the first gate electrode.

19. The semiconductor device according to claim 15, wherein the second gate dielectric layer is interposed between the insulating pattern and the second gate electrode, and
the insulating pattern directly contacts side surfaces of the stressor and the device isolation layer.

20. The semiconductor device according to claim 15, wherein a bottom of the third semiconductor layer is disposed at a level equal to or higher than an upper end of the active area.

* * * * *